United States Patent
Park et al.

(10) Patent No.: US 9,722,087 B2
(45) Date of Patent: Aug. 1, 2017

(54) ZINC OXIDE-BASED SPUTTERING TARGET, METHOD OF PREPARING THE SAME, AND THIN FILM TRANSISTOR INCLUDING A BARRIER LAYER DEPOSITED BY THE ZINC OXIDE-BASED SPUTTERING TARGET

(71) Applicant: SAMSUNG DISPLAY CO., LTD., Yongin, Gyeonggi-do (KR)

(72) Inventors: Jae-Woo Park, Gyeonggi-do (KR); Dong-Jo Kim, Gyeonggi-do (KR); Ju-Ok Park, Gyeonggi-do (KR); In-Sung Sohn, Gyeonggi-do (KR); Sang-Won Yoon, Gyeonggi-do (KR); Gun-Hyo Lee, Gyeonggi-do (KR); Yong-Jin Lee, Gyeonggi-do (KR); Yoon-Gyu Lee, Gyeonggi-do (KR); Do-Hyun Kim, Gyeonggi-do (KR); Woo-Seok Jeon, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 412 days.

(21) Appl. No.: 14/190,722

(22) Filed: Feb. 26, 2014

(65) Prior Publication Data
US 2014/0239295 A1    Aug. 28, 2014

(30) Foreign Application Priority Data
Feb. 27, 2013 (KR) .......... 10-2013-0020890

(51) Int. Cl.
H01L 29/10 (2006.01)
H01L 29/786 (2006.01)
C23C 14/34 (2006.01)

(52) U.S. Cl.
CPC ...... *H01L 29/7869* (2013.01); *C23C 14/3414* (2013.01)

(58) Field of Classification Search
CPC ....................................... H01L 29/10
See application file for complete search history.

(56) References Cited

U.S. PATENT DOCUMENTS 7,000,000 B1   2/2006  O'Brien
2005/0239660 A1*  10/2005  Abe .......... C04B 35/01
                                              505/475

(Continued)

FOREIGN PATENT DOCUMENTS

JP    2001131736    5/2001
JP    2012049209    3/2012

(Continued)

OTHER PUBLICATIONS

Registration Determination Certificate issued by the Korean Intellectual Property Office on Jan. 15, 2015 for Korean Patent Application No. 10-2013-0020890.

*Primary Examiner* — Marvin Payen
(74) *Attorney, Agent, or Firm* — F. Chau & Associates, LLC

(57) ABSTRACT

Provided are a zinc oxide-based sputtering target, a method of preparing the same, and a thin film transistor including a barrier layer deposited by the zinc oxide-based sputtering target. The zinc oxide-based sputtering target includes a sintered body that is composed of zinc oxide in which indium oxide is doped in a range from about 1% w/w to about 50% w/w. A backing plate is coupled to a back of the sintered body. The backing plate supports the sintered body.

19 Claims, 3 Drawing Sheets

(56) References Cited

U.S. PATENT DOCUMENTS

| | | | |
|---|---|---|---|
| 2009/0211903 A1* | 8/2009 | Lee | C23C 14/08 204/298.13 |
| 2011/0168994 A1 | 7/2011 | Kawashima et al. | |
| 2011/0180392 A1 | 7/2011 | Yano et al. | |
| 2011/0201162 A1 | 8/2011 | Hosono et al. | |
| 2012/0085641 A1 | 4/2012 | Herzog et al. | |
| 2013/0341181 A1 | 12/2013 | Park et al. | |

FOREIGN PATENT DOCUMENTS

| | | |
|---|---|---|
| JP | 2012180263 | 9/2012 |
| JP | 2014005538 | 1/2014 |
| KR | 1020080072136 | 8/2008 |
| KR | 1020090000421 | 1/2009 |
| KR | 1020090092165 | 8/2009 |
| KR | 1020100010300 | 2/2010 |
| KR | 1020100079320 | 7/2010 |
| KR | 1020120066364 | 6/2012 |

* cited by examiner (a)　　　　　　　　　　(b)

(a)　　　　　　　　　　(b)

ZINC OXIDE-BASED SPUTTERING TARGET, METHOD OF PREPARING THE SAME, AND THIN FILM TRANSISTOR INCLUDING A BARRIER LAYER DEPOSITED BY THE ZINC OXIDE-BASED SPUTTERING TARGET

CROSS-REFERENCE TO RELATED APPLICATION

This application claims priority under 35 U.S.C. §119 to Korean Patent Application No. 10-2013-0020890, filed on Feb. 27, 2013, in the Korean Intellectual Property Office, the disclosure of which is incorporated by reference herein in its entirety.

TECHNICAL FIELD

Exemplary embodiments of the present invention relate to a zinc oxide-based sputtering target, and more particularly to a method of preparing the same, and a thin film transistor including a barrier layer deposited by the zinc oxide-based sputtering target.

DISCUSSION OF RELATED ART

A liquid crystal display device or an electroluminescence display device provides high display performance and low power consumption. The liquid crystal display device or the electroluminescence display device is widely used in cell phones, personal computers, word processors, and televisions. Such display devices may be driven by a transistor including a thin film transistor (TFT) that is formed by fine patterns.

An electrode in the fine patterns may be, for example, a gate electrode, a source electrode, and a drain electrode. Exemplary electrode materials may include aluminum, molybdenum, and the like. However, for a high definition display, a material having high electrical conductivity may be needed. Copper, which has relatively high electrical conductivity and is less expensive compared to other metal materials, may be used as an electrode material.

A copper electrode has excellent electrical conductivity, and thus the same characteristics can be implemented even when the copper electrode is thinner than other electrodes. Accordingly, a tact time can be reduced in a process, and production costs can be also reduced. A copper electrode is applicable to products with specifications requiring high electrical conductivity.

However, the copper electrode has high reactivity with other materials. Thus, the copper atoms can be diffused throughout layers that are formed of other materials on an upper or a lower part of the copper electrode in TFT configuration. The copper electrode can be reactive with other layers, and accordingly a problem of TFT performance degradation may occur. When a protective layer referred to, for example, as a passivation layer is deposited on top surfaces of a source electrode and a drain electrode, copper can be oxidized and the contact with the protective layer can be degraded. Accordingly, problems such as delamination of the protective layer and TFT performance degradation may occur.

Therefore, introduction of a barrier layer has become a concern with regard to the formation of the copper electrode.

SUMMARY

Exemplary embodiments of the present invention are provided. There is provided a zinc oxide-based sputtering target that may perform direct current (DC) sputtering, and may increase contact and etching characteristics of a barrier layer deposited by the zinc oxide-based sputtering target. A method of preparing the zinc oxide-based sputtering target, and a thin-film transistor (TFT) including the barrier layer are provided.

In accordance with an exemplary embodiment of the present invention, a zinc oxide-based sputtering target includes a sintered body including zinc oxide doped with indium oxide in a range from about 1% w/w to about 50% w/w based on a weight of zinc oxide. A backing plate is coupled to a back of the sintered body, the backing plate supporting the sintered body.

In accordance with an exemplary embodiment of the present invention, the sintered body may have a resistivity of $1 \times 10^{-2}$ $\Omega \cdot$cm or less.

In accordance with an exemplary embodiment of the present invention, the zinc oxide-based sputtering target may be capable of performing a direct current (DC) sputtering.

In accordance with an exemplary embodiment of the present invention, a power density in a range from about 0.1 W/cm$^2$ to about 8 W/cm$^2$ may be applied to the zinc oxide-based sputtering target.

In accordance with an exemplary embodiment of the present invention, the sintered body may have a density of 5.6 g/cm$^3$ or greater.

In accordance with an exemplary embodiment of the present invention, aggregations of indium oxide may be dispersed within the sintered body in a size of less than 1 μm.

In accordance with an exemplary embodiment of the present invention, the sintered body may include one or more elements belonging to Group 3 of the periodic table of elements, or one or more elements belonging to Group 4 of the periodic table of elements, or a combination of two or more elements from Group 3 or Group 4 of the periodic table of elements.

In accordance with an exemplary embodiment of the present invention, a thin-film transistor includes a copper layer including a gate electrode, a source electrode, a drain electrode, and/or wiring. A barrier layer is deposited on the copper layer by sputtering using a zinc oxide-based sputtering target. The zinc oxide based sputtering target has a sintered body including zinc oxide doped with indium oxide in a range from about 1% w/w to about 50% w/w based on a weight of zinc oxide. An oxide layer is deposited on top of the barrier layer.

In accordance with an exemplary embodiment of the present invention, the barrier layer may have a crystal size in a range from about 10 μm to about 5,000 μm.

In accordance with an exemplary embodiment of the present invention, the barrier layer has a thickness in a range from about 30 to about 50 nm.

In accordance with an exemplary embodiment of the present invention, the barrier layer has a resistivity in a range from about 1×10−1 $\Omega \cdot$cm to about 1×10−3 $\Omega \cdot$cm.

In accordance with an exemplary embodiment of the present invention, a method of preparing a zinc oxide-based sputtering target includes adding indium oxide to zinc oxide in a range from about 1% w/w to about 50% w/w based on a weight of zinc oxide. The method includes drying the slurry to a granular powder. The method includes molding the granular powder into a molded body, and sintering the molded body into a sintered body.

In accordance with an exemplary embodiment of the present invention, the method may include a first dispersion in which a suspension is formed by mixing a first amount of zinc oxide with a solution of distilled water and a first dispersant, and the suspension is then wet-milled. The method may include a second dispersion in which a second dispersant and a second amount of zinc oxide are mixed in the suspension obtained from the first dispersion to prepare the slurry, and the slurry is then wet-milled.

In accordance with an exemplary embodiment of the present invention, the average particle size of the first amount of zinc oxide may be maintained in a range from about 0.1 µm to about 0.8 µm in the first dispersion.

In accordance with an exemplary embodiment of the present invention, the first dispersant may be in a range from about 0.1 t % w/w to about 2% w/w based on a weight of zinc oxide, in the first dispersion.

In accordance with an exemplary embodiment of the present invention, the second dispersant may be added in a range from about 0.3% w/w to about 2.5% w/w based on a weight of indium oxide, in the second dispersion.

In accordance with an exemplary embodiment of the present invention, the slurry may be controlled to have an average particle size in a range from about 0.1 µm to about 0.5 µm, in the second dispersion.

In accordance with an exemplary embodiment of the present invention, the method may include adding a binder to the slurry.

In accordance with an exemplary embodiment of the present invention, sintering the molded body may be performed at a temperature in a range from about 1,200° C. to about 1,500° C. in an atmosphere of air and oxygen.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION

Hereinafter, exemplary embodiments of the present invention will be described in detail with reference to the accompanying drawings. However, the present invention should not be construed as limited to the exemplary embodiments set forth herein and may be embodied in different forms.

Figure 5:
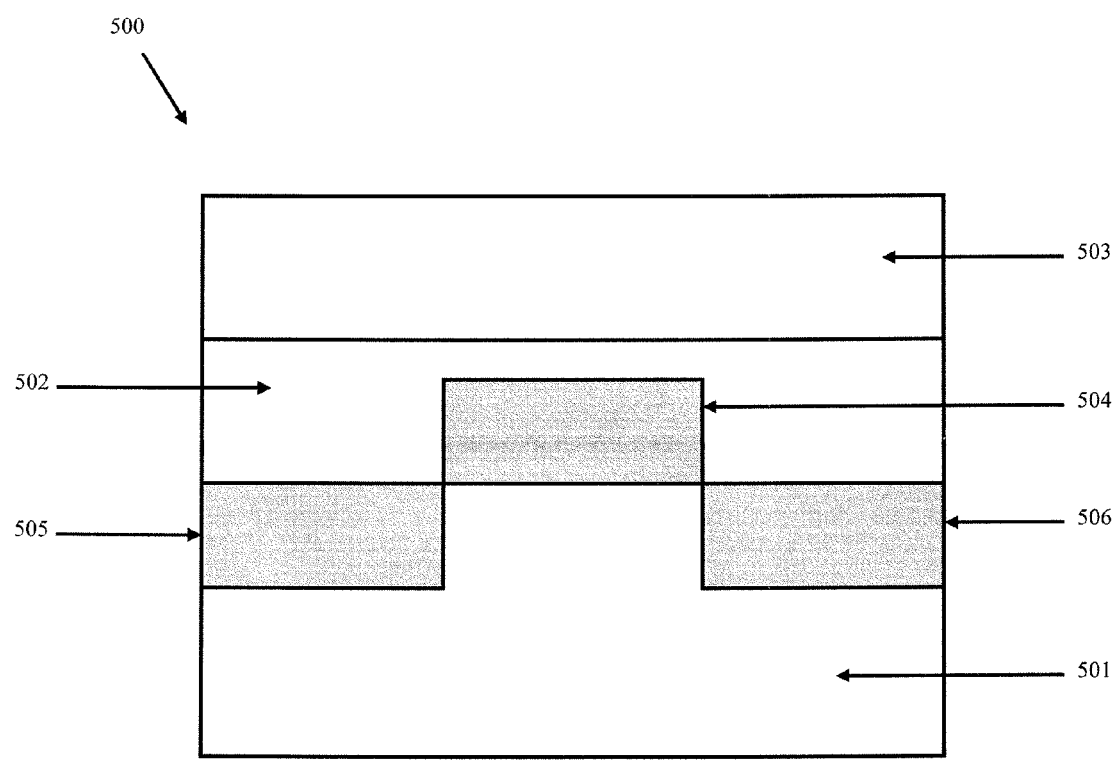
FIG. 5 illustrates a thin film transistor (TFT) according to an exemplary embodiment of the present invention.

According to an exemplary embodiment of the present invention, a zinc oxide-based sputtering target may be a target for disposition of a zinc oxide-based barrier layer. In a manufacturing process of a thin film transistor (TFT) (see, e.g., TFT 500 illustrated in FIG. 5) that may constitute a flat display including a copper electrode (e.g. copper layer 501), the zinc oxide-based sputtering target may be used to form the barrier layer (e.g., barrier layer 502). The barrier layer can inhibit diffusion of copper into an oxide layer (e.g., oxide layer 503). The barrier layer may be a protective layer formed on a gate electrode 504, a source electrode 505, a drain electrode 506, or metal wires. The barrier layer may inhibit reaction of copper with the oxide layer. The barrier layer may be applicable to a display since it has high transmissivity and may be simultaneously etched with copper under existing etching conditions. The barrier layer may adjust an etching rate to prevent occurrence of problems such as undercut and tip.

The above-described zinc oxide-based sputtering target may include a sintered body and a backing plate.

The sintered body may be formed of zinc oxide in which indium oxide is doped in a range from about 1% w/w to about 50% w/w. When indium oxide is doped in a range less than 1 wt %, a zinc oxide-based barrier layer deposited therefrom may have low resistivity, and accordingly may be suitable for use as a transparent conductive layer. The barrier layer may have a fast etching rate for manufacturing the TFT, and thus problems such as erosion by undercut or tip during the etching process may occur. When indium oxide is doped in a range greater than 50% w/w, the target might not perform a direct current (DC) sputtering process. Thus, indium oxide may be doped, for example, in a range from about 20% w/w to about 40% w/w in zinc oxide. A zinc oxide-based sputtering target that can perform direct current (DC) sputtering may improve contact and etching characteristics of a barrier layer deposited by the zinc oxide-based sputtering target.

According to an exemplary embodiment of the present invention, indium oxide may be uniformly dispersed in zinc oxide. An aggregation of indium oxide that is dispersed within the sintered body may have a size of less than 1 µm. Localized uniformity of resistance of the sintered body may be in a range from about 0% to about 10%, and uniformity of a composition may be also in a range from about 0% to about 10%. Thus, a barrier layer deposited by the sintered body may also have uniform characteristics. According to exemplary embodiments of the present invention, the sintered body may include elements belonging to Group 3 and/or Group 4 of the periodic table of elements. For example, Group 3 elements may include gallium (Ga) and/or aluminum (Al) and Group 4 elements may include zirconium (Zr), silicon (Si), and/or tin (Sn).

According to an exemplary embodiment of the present invention, the sintered body may have a resistivity of equal to or less than $1 \times 10^{-2}$ Ω·cm and a density of 5.6 g/cm$^3$ or greater. The sputtering target, including the above-described sintered body, may have stable discharge characteristics without having anomalous discharge during the DC sputtering process in which applied power density is in a range from about 0.1 W/cm$^2$ to about 8 W/cm$^2$.

The backing plate is a member that may support the sintered body. The backing plate may be formed of copper having high conductivity and high thermal conductivity. The backing plate may be formed of, for example, oxygen-free copper, titanium, or stainless steel. The backing plate may be, for example, bonded to the back of the sintered body by using a bonding material formed of indium, to form the zinc oxide-based sputtering target.

The zinc oxide-based sputtering target including the sintered body and the backing plate may less frequently cause a blackening phenomenon. The blackening phenomenon typically occurs in a general sputtering target. Thus, particle defects may be reduced during the sputtering deposition process. The zinc oxide-based sputtering target may be prepared by controlling the manufacturing process, which will be described in more detail below.

According to an exemplary embodiment of the present invention, the zinc oxide-based sputtering target may be used in the deposition of the zinc oxide-based barrier layer that is included in the TFT. The TFT may include a copper layer and a protective layer. The copper layer may include the gate electrode, the source electrode, the drain electrode, and/or the wirings, and the protective layer may be deposited as an oxide layer on top of the copper layer. When a $SiO_x$-based oxide (silicon oxide) layer is deposited on top of the copper layer, copper from the copper layer may react with the oxide layer, and accordingly may form $CuO_x$. When $CuO_x$ is formed by the reaction of copper with the oxide layer, the copper layer may be discolored and contact between the copper layer and the oxide layer may be degraded. Accordingly, problems such as delamination of the oxide layer and degradation of TFT performance may occur. When the zinc oxide-based barrier layer is deposited on top of the copper layer by using the zinc oxide-based sputtering target during the TFT manufacturing process, a reaction between the copper layer and the oxide layer may be inhibited.

The barrier layer deposited by the zinc oxide-based sputtering target may have a crystal size in a range from about 10 μm to about 5,000 μm. The barrier layer may be deposited to a thickness in a range from about 30 nm to about 50 nm. The barrier layer may have a resistivity in a range from about $1\times10$ Ω·cm to about $1\times10^{-3}$ Ω·cm. To form the barrier layer, argon gas and oxygen gas may be mixed in a predetermined ratio to perform the sputtering, in addition to deposition using the zinc oxide-based sputtering.

In exemplary embodiments of the present invention, the zinc oxide-based sputtering target may form the barrier layer in a single phase or in a composite phase according to preparation conditions. The barrier layer may be composed of a hexagonal lamellar compound. The barrier layer deposited by the zinc oxide-based sputtering target may be etched with a weak acid when the etching is performed. Thus, an etching rate may be controlled by adjusting a concentration and a composition of an etching solution, such as, for example, the weak acid. In exemplary embodiments of the present invention, the etching rate with respect to the etching of the barrier layer may be controlled to be in a range from about 1 Å/sec to about 500 Å/sec, for example, about 5 Å/sec to about 500 Å/sec. Accordingly, the barrier layer may be simultaneously etched with the copper layer using the existing etching solution used to form the copper layer, without requiring a further process. Thus, the barrier layer may contribute to the ease and simplicity of the TFT manufacturing process. To improve etching characteristics of the barrier layer, the barrier layer may be heat treated at a temperature in a range from about 200° C. to about 400° C. for about 10 minutes to about 120 minutes, for example.

Hereinafter, a method of preparing the zinc oxide-based sputtering target will be described in detail.

As described above, to implement characteristics of the barrier layer deposited by the zinc oxide-based sputtering target in exemplary embodiments of the present invention, the method of preparing the zinc oxide-based sputtering target needs to be highly controlled. The method includes preparing a slurry, drying, molding, and sintering.

In the preparing the slurry, indium oxide may be added to zinc oxide in a range from about 1% w/w to about 50% w/w based on a weight of zinc oxide. The preparing the slurry may include a first dispersion and a second dispersion.

In the first dispersion, zinc oxide may be mixed with a solution of distilled water and a first dispersant, and then may be wet-milled to have an average dispersion size in a range from about 0.1 μm to about 0.8 μm. An amount of the added dispersant may be in a range from about 0.1% w/w to about 2% w/w based on a weight of zinc oxide. The dispersant may be configured to be easily absorbed on surfaces of zinc oxide and/or indium oxide. The dispersant may be subsequently added to a suspension including zinc oxide and/or indium oxide that is prepared by the wet milling. An organic acid such as, for example, citric acid and/or polycarboxylic acid may be used as the dispersant. To implement high dispersion characteristics of zinc oxide particles and indium oxide particles, the dispersant may maintain a pH of the suspension as it is. A salt of polycarboxylic acid, an ammonium salt of plyacrylate, or an amine salt of polyacrylate may be used as the dispersant. In the first dispersion, zinc oxide may be dispersed as described above.

In the second dispersion, indium oxide may be added in a range from about 1% w/w to about 50% w/w, for example, about 20% w/w to about 40% w/w, to the suspension in which zinc oxide is dispersed. Then, a second dispersant may be added thereto in a range from about 0.3% w/w to about 2.5% w/w based on a weight of zinc oxide, to prepare a slurry. The slurry may then be wet-milled to have an average particle size in a range from about 0.1 μm to about 0.5 μm. An amount of the added dispersant and the average particle size thereof may be closely related to each other. When there is a discrepancy between the dispersion conditions and ratios of the particle size, the sintered body that is prepared by subsequent processes may have a partially rapidly increasing resistance due to aggregation of zinc oxide and indium oxide that have no electrical properties therein. Accordingly, the stable DC sputtering of the zinc oxide-based sputtering target that is prepared may be disrupted, and composition uniformity of the thin film, which is the barrier layer deposited by the zinc oxide-based sputtering target may be affected. In exemplary embodiments of the present invention, adjustment of the dispersion size of both the indium oxide particles and the slurry particles may be closely related to sintering temperatures. When the size of the dispersed particles is not within the above ranges, an abnormal volatilization of zinc oxide may be caused during a high-temperature sintering.

A binder may be added to the slurry that is prepared after the second dispersion is completed. The binder may be added to the slurry to maintain a molding strength of a molded body formed during the molding process after the slurry is dried and prepared as powder. Examples of the binder are polyvinyl alcohol and polyethylene glycol. Here, the binder may be added in a range from about 0.01% w/w to about 5% w/w, for example, about 0.5% w/w to about 3% w/w. The amount of binder may be based on a weight of indium oxide powder and zinc oxide powder in the slurry. An amount of the binder may affect sintering density of the sintered body. When the amount of the binder is not within the above ranges, the molding density may be decreased during the molding of granular powder, and the sintering density may also be decreased. A decrease in the sintering density may refer to a formation of pores inside the sintered body, and partially high resistance may result therein. Thus, the pores may become obstacles when preparing the zinc oxide-based sputtering target that may perform DC sputtering.

Wet milling may be conducted in divided steps according to exemplary embodiments of the present invention as follows. The average particle sizes of dry powdered materials may be different from each other, and hardness and cohesion of the powder itself may be different. Thus, when all the materials are mixed at once and wet-milled, it may be hard to control a particle size of each of the powdered materials as desired. Indium oxide might not be uniformly dispersed in a zinc oxide matrix when preparing the sintered body, and a partial aggregation phenomenon may occur. Accordingly, electrical and mechanical properties of the target may be decreased. In order to uniformly disperse indium oxide with zinc oxide, dispersion may be conducted by the first dispersion and the second dispersion.

The drying of the slurry in the method of preparing the zinc oxide-based sputtering target refers to the slurry being dried to a granular powder. The slurry may be spray-dried to granular powder, for example.

The molding of the granular powder in the method of preparing the zinc oxide-based sputtering target refers to the granular powder being molded to a molded body. The granular powder may be molded by a cold press (that is oil-hydraulic press) and/or a cold isostatic press, for example.

The sintering of the molded body in the method of preparing the zinc oxide-based sputtering target refers to the molded body being sintered to prepare a sintered body. The molded body may be sintered at a temperature in a range from about 1,200° C. to about 1,500° C., for example, in air or in an atmosphere of oxygen. In regard to the manufacturing process of an indium oxide-doped zinc oxide-based sputtering target, the sintering temperature may be controlled to provide the target resistance in a range from about $1 \times 10^{-3} \Omega$ to about $50 \Omega$ which makes the DC sputtering possible. The sintering of the molded body may proceed as a process having high density and low resistance.

When the sintered body is bonded to the backing plate, the manufacture of the zinc oxide-based sputtering target may be completed according to an exemplary embodiment of the present invention.

The zinc oxide-based sputtering target, which is the sintered body, may have a resistivity of smaller than $1 \times 10^{-2}$ $\Omega \cdot cm$. Thus, when the TFT is manufactured using the DC sputtering, the barrier layer may be stably formed as a film on top of the copper layer. During the film formation, the applied power density of the DC sputtering may be maintained within a range from about 0.1 $W/cm^3$ to about 8 $W/cm^3$. A glow discharge may occur when the applied power density is not within the above ranges, but problems such as anomalous discharge may occur. Thus, the target may contain cracks, and accordingly might not be worthy of industrial use.

When the barrier layer is deposited by the DC sputtering using the zinc oxide-based sputtering target, the barrier layer may obtain resistivity in a range from about $1 \times 10^{-1}$ $\Omega \cdot cm$ to about $1 \times 10^{-3}$ $\Omega \cdot cm$ with respect to a thickness of 30 nm. When the barrier layer is deposited by the zinc oxide-based sputtering target, a vacuum base pressure in a chamber may be maintained in a range from about $1 \times 10^{-7}$ torr to about $1 \times 10^{-5}$ torr. For example, when the vacuum base pressure is within the above ranges, a high-quality barrier layer may be obtained by using the zinc oxide-based sputtering target. When depositing the barrier layer, oxygen-like reactive gas and/or argon gas may be injected to control crystallinity and resistance of the barrier layer. The deposited barrier layer may be heat treated at a temperature in a range from about 200° C. to about 400° C. to improve etching characteristics.

The barrier layer, which is deposited by the zinc oxide-based sputtering target and the heat-treated barrier layer according to exemplary embodiments of the present invention, might not cause problems such as undercut or tip, due to excellent straight-ability in the etching between an upper layer and a bottom layer in the etchant used for etching a copper layer during the TFT manufacturing process. When the etching rate is too slow, mass production may be decreased. On the contrary, when the etching rate is too fast, the process may be difficult to control. When the barrier layer is formed using the zinc oxide-based sputtering target according to exemplary embodiments of the present invention and the etching is performed according to exemplary embodiments of the present invention, the etching rate may be maintained in a range from about 1 Å/sec to about 500 Å/sec. Thus, problems caused by non-uniform etching may be prevented.

Example 1

Zinc oxide having an average particle size of 0.5 μm was added to distilled water including 1.0% w/w of a dispersant based on a weight of zinc oxide. The zinc oxide was added in 65% w/w, 70% w/w, and 75% w/w based on a total weight of the sintered body for the sputtering target. Then, the zinc oxide was crushed and dispersed to have an average particle size of 0.2 μm by using wet milling. Next, 0.5% w/w of the dispersant based on a weight of zinc oxide and indium oxide, which have the average particle size of 0.5 μm, was added thereto and wet-milled to have the final dispersion particle size of 0.2 μm. Here, the dispersant was an amine salt of polyacrylate. After a final zinc oxide-based slurry was obtained, 1.0% w/w of PVA and 0.5% w/w of PEG were added as binders, followed by one more millings, to prepare a uniform slurry. Then, the slurry was spray-dried to granular powder, and then was compressed by an axial compressor to perform cold isostatic molding.

Figure 1:
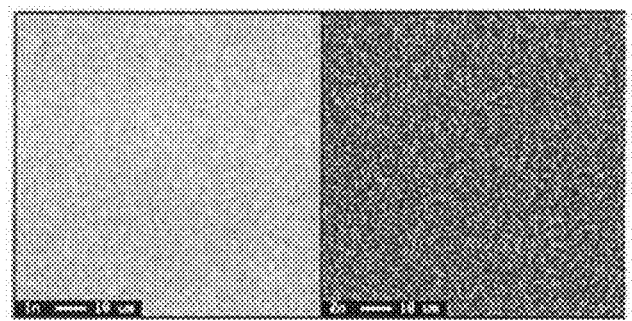
FIG. 1 is an image showing results of an analysis using an electron probe micro analyzer (EPMA) of the sintered bodies prepared by a method of preparing a sputtering target according to an exemplary embodiment of the present invention.

Next, the molded body was sintered at a temperature of 1,400° C. for 20 hours in an atmosphere of air and oxygen. Resistivity of the molded bodies after completing the sintering was 4.7 $\Omega \cdot cm$, 7.3 $\Omega \cdot cm$, and $8.0 \times 10^{-3}$ $\Omega \cdot cm$, respectively, and sintering densities thereof were 5.72 $g/cm^3$, 5.81 $g/cm^3$, and 5.91 $g/cm^3$, respectively. Based on an analysis using an electron probe micro analyzer (EPMA) of the sintered bodies, aggregation of the indium oxides that are dispersed in the zinc oxides was observed, and results thereof are shown in FIG. 1. Referring to FIG. 1, indium oxides were uniformly dispersed in a zinc oxide-matrix and the size of the indium oxide particles were all smaller than 1 μm.

Example 2

Figure 2:
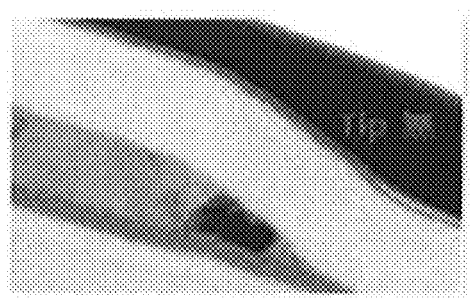
FIG. 2 is a transmission electron microscope (TEM) image showing results of an etching test with respect to a barrier layer deposited by the sputtering target according to an exemplary embodiment of the present invention.

The sintered body of Example 1 was bonded to the backing plate that is formed of copper, to perform the sputtering. Sputtering conditions included a chamber vacuum base pressure of $1 \times 10^{-6}$ torr and an operating pressure of 0.5 Pa. The film was deposited through sputtering by causing a plasma discharge at a temperature of 100° C. in an atmosphere of pure argon gas. The size of the target was 565 mm×690 mm and the applied power was DC 10 kW. The thin film was deposited to a thickness of 30 nm. With regard to the TFT structure, to confirm that the barrier layer deposited by the sputtering target acts as a protective layer for copper during deposition of $SiO_x$ on top of the source electrode and the drain electrode, a substrate in which a copper layer was deposited on a non-alkaline glass was used. An indium oxide including a zinc oxide thin film was deposited on the substrate using the sputtering target, and then, a $SiO_x$ thin film was deposited using a chemical vapor deposition (CVD) method. Then, the etching was performed using a liquid chemical for etching copper to the sample. Whether or not residues remained was observed by a transmission electron microscopy. Results thereof are shown in FIG. 2. Referring to FIG. 2, it was confirmed that there is no residue after performing etching.

Figure 3:
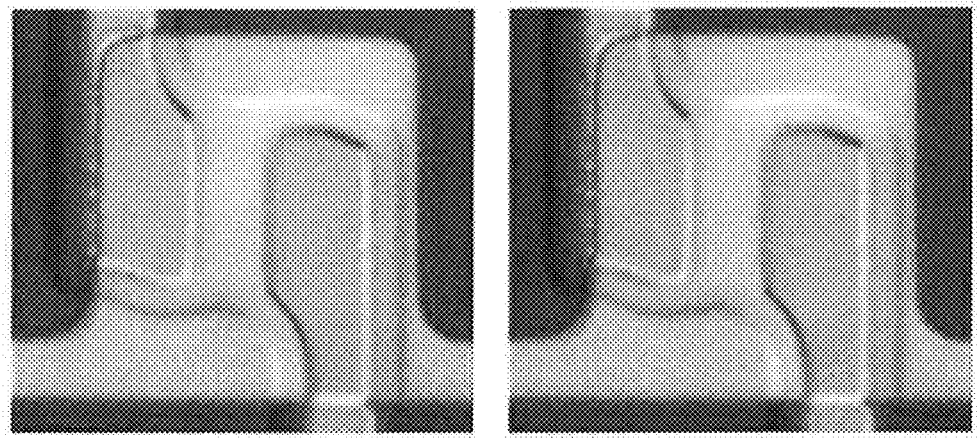
FIGS. 3A and 3B are electron microscope images illustrating the effects of the barrier layer on oxidation of copper, wherein the barrier layer is deposited according to an exemplary embodiment of the present invention.
Figure 4:
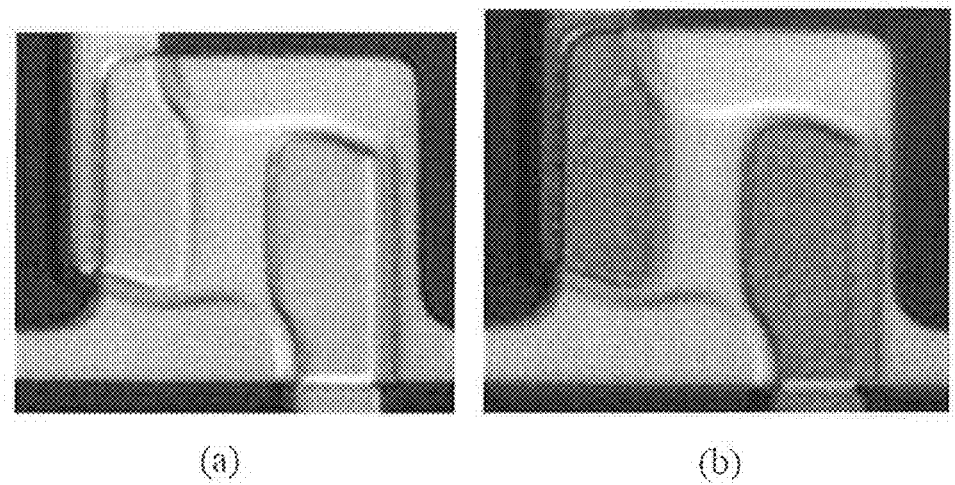
FIGS. 4A and 4B are electron microscope images to observe effects of a barrier layer on oxidation of copper, wherein the barrier layer is deposited by a sputtering target that is formed of an alloy of copper and manganese alloy.

FIGS. 3 and 4 are images showing whether or not $CuO_x$ is formed depending on the sputtering target used to form the barrier layer on the copper electrode. FIGS. 3A and 3B are images before and after $SiO_x$ deposition on the barrier layer that is deposited by the sputtering target according to exemplary embodiments of the present invention. FIGS. 4A and 4B are images before and after $SiO_x$ deposition on the barrier layer that is deposited on the copper electrode using a copper-manganese (Cu/Mn) sputtering target. In FIG. 3, there is no change before and after $SiO_x$ deposition. However, in FIG. 4, there is a change before and after $SiO_x$ deposition. That is, when the indium oxide-doped zinc oxide-based barrier layer is formed on the copper layer using the sputtering target according to exemplary embodiments of the present invention (in cases where the $SiO_x$ thin film may be formed) the reaction between the copper electrode and the $SiO_x$ thin film may be inhibited by the barrier layer. However, when the Cu/Mn-based barrier layer is formed on the copper electrode, the Cu/Mn-based barrier layer may not inhibit the reaction between the copper electrode and the $SiO_x$ thin film. Thus, $CuO_x$ may be formed by the reaction, as illustrated by the darkened area of FIG. 4B, and accordingly contact between the copper electrode and the $SiO_x$ thin film may be degraded in addition to degradation of the TFT characteristics.

As described above, according to exemplary embodiments of the present invention, indium oxide is doped in zinc oxide to prepare a high density sputtering target that may perform a direct current (DC) sputtering.

In addition, when a $SiO_x$-based oxide protective layer is deposited on top of a copper electrode such as, for example, a gate electrode, a source electrode, and a drain electrode, and a barrier layer is deposited using the sputtering target according to exemplary embodiments of the present invention during a TFT manufacturing process, $CuO_x$ formation may be prevented and, accordingly, contact between the copper electrode and the protective layer may be increased. The barrier layer according to exemplary embodiments of the present invention may be applicable to a display panel, for example. The barrier layer having a high transmissivity may be deposited on the copper layer. The barrier layer may be formed between the copper layer and the oxide protective layer.

The barrier layer formed using the sputtering target according to exemplary embodiments of the present invention may be simultaneously etched with the copper electrode, and an etching rate may be adjusted to prevent occurrence of problems such as undercut and tip. Due to the deposition of the barrier layer that prevents occurrence of problems such as, for example, erosion of the copper electrode, the barrier layer may contribute to the ease and simplicity of a TFT manufacturing process. The barrier layer deposited by the sputtering target according to exemplary embodiments of the present invention may be patterned during a copper electrode-patterning process without requiring a further process.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A zinc oxide-based sputtering target comprising:
   a sintered body comprising zinc oxide doped with indium oxide in a range from about 1% w/w to about 50% w/w based on a weight of zinc oxide, wherein the sintered body has a density of from 5.6 g/cm$^3$ to 5.95 g/cm$^3$; and
   a backing plate coupled to a back of the sintered body, the backing plate supporting the sintered body.

2. The zinc oxide-based sputtering target of claim 1, the sintered body having a resistivity of $1\times10^{-2}$ Ω·cm or less.

3. The zinc oxide-based sputtering target of claim 2, the zinc oxide-based sputtering target being capable of performing a direct current (DC) sputtering.

4. The zinc oxide-based sputtering target of claim 3, further comprising a power density in a range from about 0.1 W/cm$^2$ to about 8 W/cm$^2$ being applied to the zinc oxide-based sputtering target.

5. The zinc oxide-based sputtering target of claim 1, wherein aggregations of indium oxide are dispersed within the sintered body in a size of less than 1 μm.

6. The zinc oxide-based sputtering target of claim 1, wherein the sintered body comprises one or more elements belonging to Group 3 of the periodic table of elements, or one or more elements belonging to Group 4 of the periodic table of elements, or a combination of two or more elements from Group 3 or Group 4 of the periodic table of elements.

7. A thin-film transistor comprising:
   a copper layer comprising a gate electrode, a source electrode, a drain electrode, and/or wiring;
   a barrier layer deposited on the copper layer by sputtering using a zinc oxide-based sputtering target, the zinc oxide based sputtering target having a sintered body comprising zinc oxide doped with indium oxide in a range from about 1% w/w to about 50% w/w based on a weight of zinc oxide; and
   an oxide layer being deposited on top of the barrier layer.

8. The thin-film transistor of claim 7, wherein the barrier layer has a crystal size in a range from about 10 Å to about 5,000 Å.

9. The thin-film transistor of claim 7, wherein the barrier layer has a thickness in a range from about 30 to about 50 nm.

10. The thin-film transistor of claim 9, wherein the barrier layer has a resistivity in a range from about $1\times10^{-1}$ Ω·cm to about $1\times10^{-3}$ Ω·cm.

11. A method of preparing a zinc oxide-based sputtering target of claim 1, the method comprising:
    preparing a slurry, wherein preparing the slurry comprises adding indium oxide to zinc oxide in a range from about 1% w/w to about 50% w/w based on a weight of zinc oxide;
    drying the slurry to a granular powder;
    molding the granular powder into a molded body; and
    sintering the molded body into a sintered body, wherein the sintered body comprises zinc oxide doped with indium oxide in a range from about 1% w/w to about 50% w/w based on a weight of zinc oxide, wherein the sintered body has a density of from 5.6 g/cm$^3$ to 5.95 g/cm³, and a backing plate coupled to a back of the sintered body, the backing plate supporting the sintered body.

12. The method of claim 11, wherein preparing the slurry comprises:
   a first dispersion in which a suspension is formed by mixing a first amount of indium oxide with a solution of distilled water and a first dispersant, and the suspension is then wet-milled; and
   a second dispersion in which a second dispersant and a second amount of indium oxide are mixed in the suspension obtained from the first dispersion to prepare the slurry, and the slurry is then wet-milled.

13. The method of claim 12, wherein the average particle size of the first amount of zinc oxide is maintained in a range from about 0.1 µm to about 0.8 µm in the first dispersion.

14. The method of claim 12, wherein the first dispersant is in a range from about 0.1 w% w/w to about 2 t% w/w based on a weight of zinc oxide, in the first dispersion.

15. The method of claim 12, wherein the second dispersant is added in a range from about 0.3 w% w/w to about 2.5 t% w/w based on a weight of indium oxide, in the second dispersion.

16. The method of claim 12, wherein the slurry is controlled to have an average particle size in a range from about 0.1 µm to about 0.5 µm , in the second dispersion.

17. The method of clam 12, wherein preparing the slurry further comprises adding a binder to the slurry.

18. The method of claim 11, wherein sintering the molded body is performed at a temperature in a range from about 1,200° C. to about 1,500° C. in an atmosphere of air and oxygen.

19. A thin film transistor (TFT), comprising:
   a copper electrode;
   a zinc-oxide based barrier layer deposited on the copper electrode by a zinc oxide-based sputtering target of claim 1; and
   an oxide layer disposed on the zinc-oxide based barrier layer, wherein the zinc-oxide based barrier layer is adapted to inhibit diffusion of copper into the oxide layer.

* * * * *